(12) United States Patent
Kwon et al.

(10) Patent No.: US 10,191,114 B2
(45) Date of Patent: Jan. 29, 2019

(54) SYSTEM FOR ANALYSIS OF PARTIAL DISCHARGE DEFECTS OF GAS INSULATED SWITCHGEAR

(71) Applicant: LSIS CO., LTD., Anyang-si, Gyeonggi-do (KR)

(72) Inventors: Hyun Ho Kwon, Cheongju-si (KR); Do Hoon Lee, Cheongju-si (KR); Jin Ho Lee, Chuncheon-si (KR); Chang Hwan Jin, Cheongju-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 807 days.

(21) Appl. No.: 14/829,368

(22) Filed: Aug. 18, 2015

(65) Prior Publication Data

US 2016/0061897 A1  Mar. 3, 2016

(30) Foreign Application Priority Data

Aug. 29, 2014  (KR) .................. 10-2014-0114380

(51) Int. Cl.
*G01R 31/327* (2006.01)
*G01R 31/12* (2006.01)
*G01R 31/14* (2006.01)

(52) U.S. Cl.
CPC .......... *G01R 31/327* (2013.01); *G01R 31/12* (2013.01); *G01R 31/1254* (2013.01); *G01R 31/14* (2013.01); *G01R 31/3274* (2013.01)

(58) Field of Classification Search
CPC .. G01R 31/327; G01R 31/12; G01R 31/1254; G01R 31/14; G01R 31/3274

USPC ......................................................... 324/415
See application file for complete search history.

(56) References Cited

U.S. PATENT DOCUMENTS

| | | | |
|---|---|---|---|
| 5,214,595 A | 5/1993 | Ozawa et al. | |
| 2010/0079148 A1 | 4/2010 | Park et al. | |
| 2010/0324746 A1 | 12/2010 | Jeong | |

FOREIGN PATENT DOCUMENTS

| | | |
|---|---|---|
| CN | 1039659 | 2/1990 |
| KR | 10-0853725 | 8/2008 |
| KR | 10-2011-0125579 | 11/2011 |
| KR | 10-2012-0012103 | 2/2012 |
| WO | 2013/000806 | 1/2013 |

OTHER PUBLICATIONS

Korean Intellectual Property Office Application Serial No. 10-2014-0114380, Office Action dated Jun. 18, 2015, 5 pages.
Gross, et al., "Data Management for Parallel Partial Discharge Monitoring of Large GIS Fields," 2012 Annual Report Conference on Electrical Insulation and Dielectric Phenomena, XP55090088, Oct. 2012, 4 pages.

(Continued)

*Primary Examiner* — Melissa J Koval
*Assistant Examiner* — Rahul Maini
(74) *Attorney, Agent, or Firm* — K&L Gates LLP

(57) ABSTRACT

The present invention relates to a system for analysis of partial discharge defects of a gas insulated switchgear capable of allowing a user to precisely analyze a defect of a gas insulated switchgear due to a partial discharge, by providing both partial discharge signal information on a partial discharge signal sensed by a detecting sensor, and detection signal information on a detection signal sensed by one or more neighboring sensors adjacent to the detecting sensor, to a monitor.

4 Claims, 4 Drawing Sheets

(56) References Cited

OTHER PUBLICATIONS

Osztermayer, et al., "Asset Management Based on Improved Online Monitoring Systems Applied to a 110/380 kV Substation," 2003 IEEE Bologna Power Tech Conference, XP002614600, Jun. 2003, 5 pages.
European Patent Office Application Serial No. 15182532.0, Search Report dated Feb. 23, 2016, 11 pages.
Chinese Office Action Appl. No. 201510643999.6 dated Sep. 4, 2017—6 pages.

SYSTEM FOR ANALYSIS OF PARTIAL DISCHARGE DEFECTS OF GAS INSULATED SWITCHGEAR

CROSS-REFERENCE TO RELATED APPLICATION

Pursuant to 35 U.S.C. § 119(a), this application claims the benefit of earlier filing date and right of priority to Korean Patent Application No. 10-2014-0114380, filed on Aug. 29, 2014, the contents of which is incorporated by reference herein in its entirety.

BACKGROUND OF THE INVENTION

1. Field of the Invention

The present invention relates to a system for analysis of partial discharge defects of a gas insulated switchgear, and more particularly, to a system for analysis of partial discharge defects of a gas insulated switchgear capable of allowing a user to precisely analyze a defect of a gas insulated switchgear due to a partial discharge, by providing both partial discharge signal information on a partial discharge signal sensed by a detecting sensor, and detection signal information on a detection signal sensed by one or more neighboring sensors adjacent to the detecting sensor, to a monitor.

2. Background of the Invention

A substation is located between a transmission line and a distribution line, and converts a high transmission voltage into a low distribution voltage.

The substation is installed with a switchgear for connecting the transmission line to the distribution line, or for separating the two lines from each other. Such a switchgear is called a distribution line switchgear.

The distribution line switchgear is divided into a hydraulic type, a magnetic type, an air type, etc., and a gas insulated switchgear (GIS) using $SF_6$ having an excellent insulating property is being widely used.

However, despite such an excellent insulating property of the gas insulated switchgear, when an insulation accident occurs on a power system, a social confusion, an economical loss, etc. may be caused. Thus, it is absolutely required to prevent such an insulation accident.

Accordingly, a technique for automatically sensing a partial discharge, a representative cause of a thermal degradation of the gas insulated switchgear, is being actively researched.

The partial discharge (PD) is a discharge phenomenon which partially occurs along the periphery or the inside of an insulator, under a stress of a high voltage. The partial discharge is generally generated from a partial crack due to a gap naturally formed, or a thermal degradation of the switchgear.

The partial discharge may cause power loss due to power leakage. In some cases, the partial discharge may cause an irreversible physical or chemical change on an insulating material. This may cause complete cutoff of power supply through a distribution line, or explosion of equipment.

Such a partial discharge of the conventional gas insulated switchgear (GIS) is diagnosed through an artificial intelligence technique such as an artificial neural network algorithm or a fuzzy inference technique. More specifically, an input variable, feature amount data, is extracted through a pattern analysis with respect to measured data on a partial discharge, and a result is inferred through an artificial intelligence technique such as an artificial neural network algorithm or a fuzzy inference technique.

FIG. 1 is a view schematically illustrating a configuration of an online partial discharge diagnosis system in accordance with the conventional art.

As shown in FIG. 1, a partial discharge signal is sensed by a discharge detecting sensor (not shown) installed at a switchgear, and information on the sensed signal is collected by a data acquisition unit (DAU) 1. Then, the information is stored in a database server 3 via a DAU communication server 2.

Information on a partial discharge charge amount and the number of times of partial discharge, among the partial discharge signal, is stored with time information. A defect pattern is recognized through a partial discharge diagnosis algorithm 4, and a chart indicating a defect type and an occurred signal is output to a screen 5.

A diagnosis screen indicating a partial discharge, output to the screen 5, may be implemented in various manners. For instance, the diagnosis screen indicating a partial discharge, may be implemented as a list of partial discharge occurrence events, a determination result chart, a 2D chart, a 3D chart, etc.

The list of partial discharge occurrence events displays an occurrence history of all partial discharges, and the determination result chart displays a result on analysis of defects of partial discharge occurrence events, in the form of a proportion with respect to each defect. The 2D chart displays a phase, a size and the number of times of a partial discharge signal, in a 2D form. And the 3D chart displays a phase, a size and the number of times of a partial discharge signal, in a 3D form.

The data means data on a partial discharge signal of a single sensor, selected from the list of partial discharge occurrence events.

However, in the conventional system for diagnosis of a partial discharge of a gas insulated switchgear, only information on a partial discharge signal sensed by the detecting sensor is provided to a monitor. This may cause a difficulty in precisely diagnosing whether a defect of the switchgear exists on a position where a partial discharge has occurred, and a cause of the occurrence of the defect.

SUMMARY OF THE INVENTION

Therefore, an aspect of the detailed description is to provide a system for analysis of partial discharge defects of a gas insulated switchgear, capable of precisely analyzing a defect of the gas insulated switchgear due to a partial discharge, by providing both partial discharge signal information on a partial discharge signal sensed by a detecting sensor, and detection signal information on a detection signal sensed by one or more neighboring sensors adjacent to the detecting sensor, to a monitor.

To achieve these and other advantages and in accordance with the purpose of this specification, as embodied and broadly described herein, there is provided a system for analysis of partial discharge defects of a gas insulated switchgear, including: a detecting sensor configured to sense a signal generated from the gas insulated switchgear; one or more neighboring sensors arranged close to the detecting sensor, and configured to sense a signal generated from the periphery of the detecting sensor; a controller configured to determine whether the signal sensed by the detecting sensor is a partial discharge signal or not, configured to calculate a partial discharge charge amount and the number of times of partial discharge based on a detection signal sensed by the neighboring sensor when the partial discharge signal is sensed, if it is determined that the signal sensed by the detecting sensor is the partial discharge signal, configured to display partial discharge signal information on the partial discharge signal and detection signal information on the detection signal when the partial discharge charge amount and the number of times of partial discharge are more than a reference value, and configured to display only the partial discharge signal information on the partial discharge signal when the partial discharge charge amount and the number of times of partial discharge are less than the reference value; and a display unit configured to display only the partial discharge signal information, or both the partial discharge signal information and the detection signal information, under control of the controller.

The system for analysis of partial discharge defects of a gas insulated switchgear may further include a storage unit configured to store therein the detection signal information of the neighboring sensors on the partial discharge charge amount and the number of times of partial discharges more than the reference value, under control of the controller, if the partial discharge charge amount and the partial discharge signal are more than the reference value.

The display unit may be further configured to display position information of the detecting sensor and the neighboring sensor.

The partial discharge signal information and the detection signal information may be PRPD pattern information.

The present invention can have the following advantages.

Firstly, both partial discharge signal information sensed by the detecting sensor, and detection signal information sensed by the neighboring sensor disposed close to the detecting sensor are provided to a monitor (a surveillant or a user) through a single screen. This can allow the monitor to more precisely determine whether a defect has occurred from the gas insulated switchgear, and a defect cause of the gas insulated switchgear.

Secondly, when searching for a history of occurrence of a partial discharge, a monitor can check not only history information of the detecting sensor which has sensed a partial discharge signal, but also history information of the neighboring sensor arranged close to the detecting sensor. This can enhance a user's convenience in analyzing defects, or enhance accuracy on analysis of defects.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, a system for analysis of partial discharge defects of a gas insulated switchgear according to an embodiment of the present invention will be explained in more detail with reference to the attached drawings.

Figure 1:
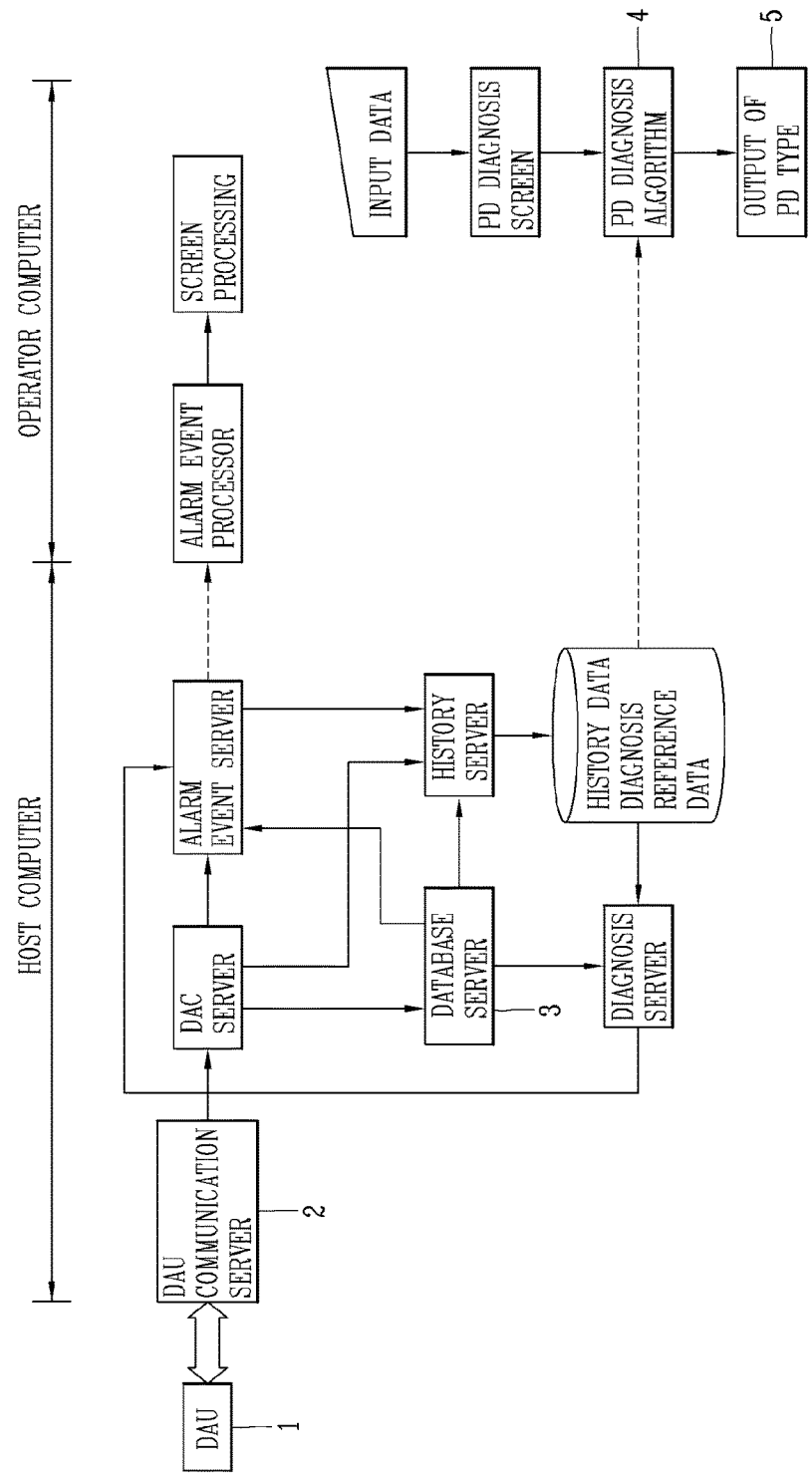
FIG. 1 is a view schematically illustrating a configuration of an online partial discharge diagnosis system in accordance with the conventional art.
Figure 2:
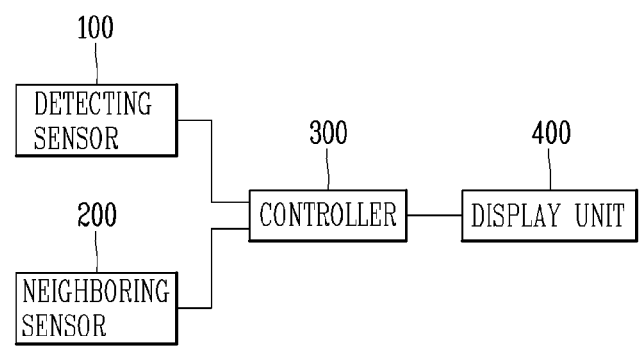
FIG. 2 is a view schematically illustrating a configuration of a system for partial discharge defects of a gas insulated switchgear according to a first embodiment of the present invention.
Figure 3:
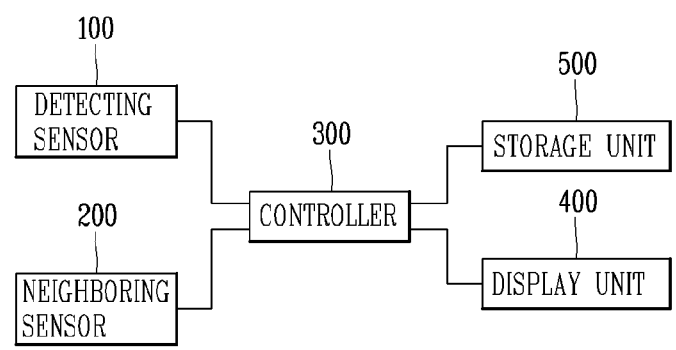
FIG. 3 is a view schematically illustrating a configuration of a system for analysis of partial discharge defects of a gas insulated switchgear according to a second embodiment of the present invention.
Figure 4A:
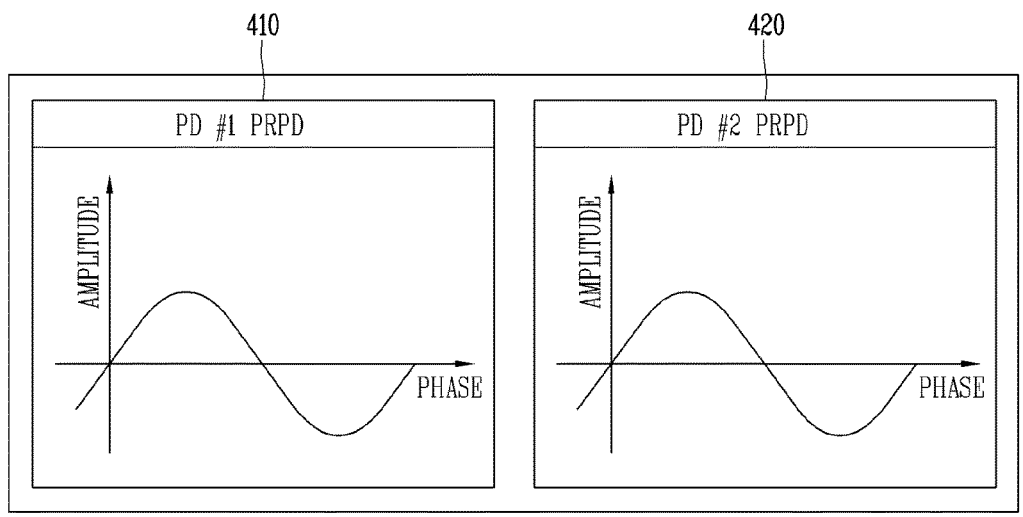
FIG. 4A is an exemplary view illustrating that a PRPD screen for a partial discharge signal is displayed on a display unit of a gas insulated switchgear according to the present invention.
Figure 4B:
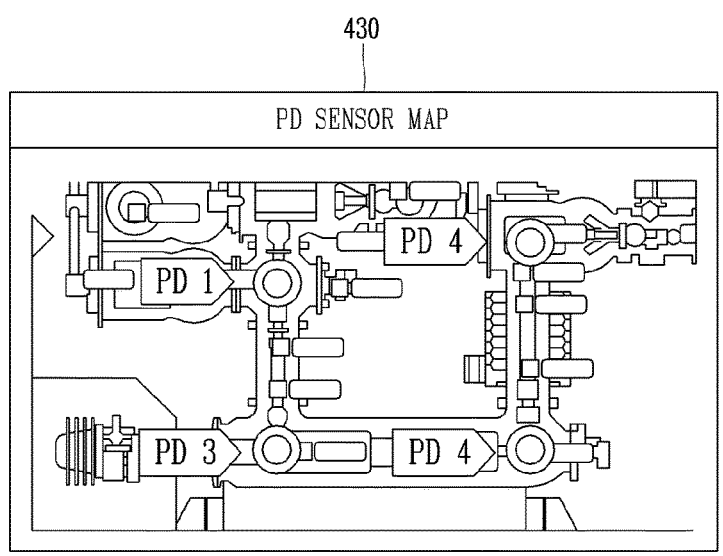
FIG. 4B is an exemplary view illustrating that position information of a detecting sensor and a neighboring sensor is displayed on a screen of a display unit.
Figure 5:
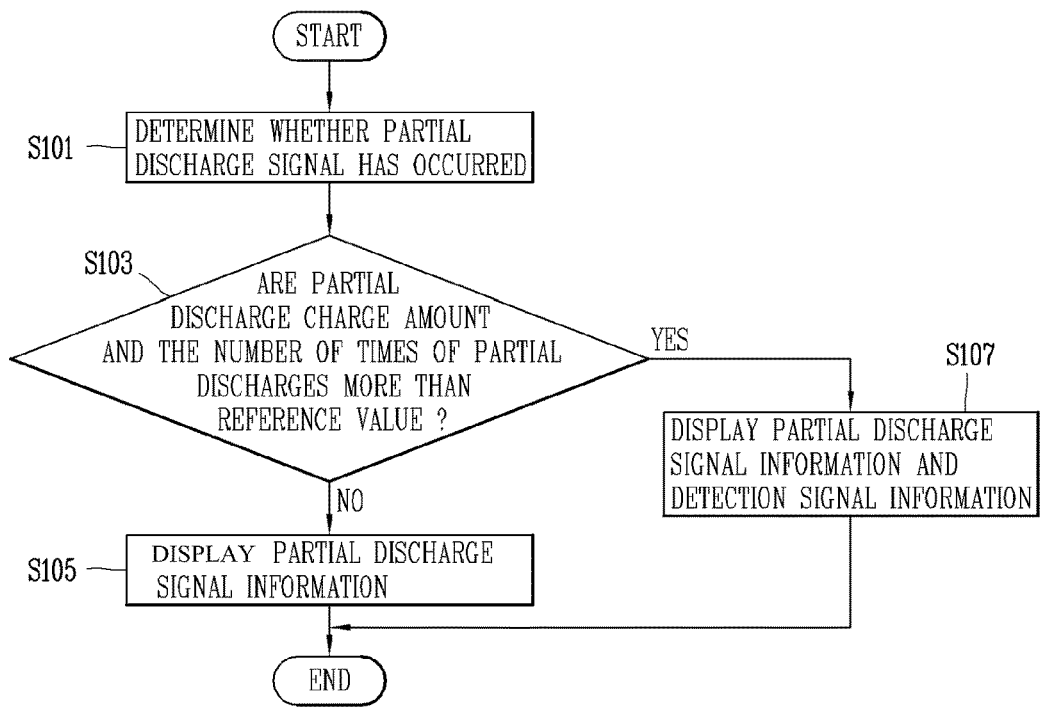
FIG. 5 is a flowchart illustrating a method for analyzing partial discharge defects of a gas insulated switchgear according to a first embodiment of the present invention.
Figure 6:
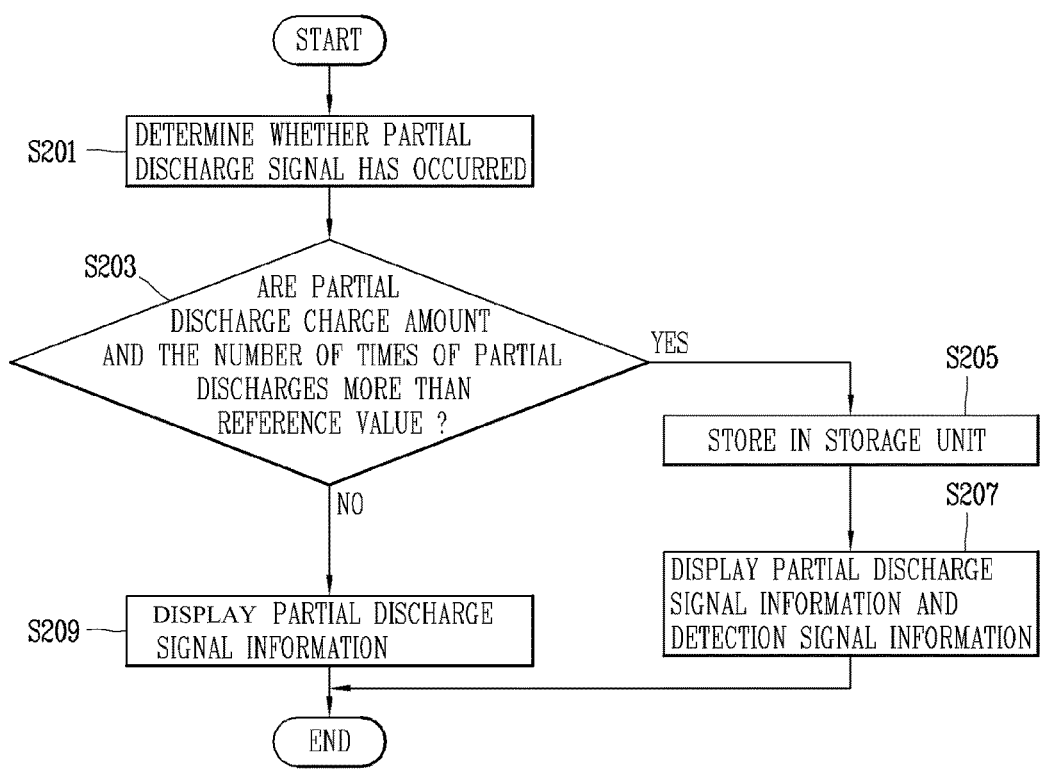
FIG. 6 is a flowchart illustrating a method for analyzing partial discharge defects of a gas insulated switchgear according to a second embodiment of the present invention.

FIG. 2 is a view schematically illustrating a configuration of a system for analysis of partial discharge defects of a gas insulated switchgear according to a first embodiment of the present invention. FIG. 3 is a view schematically illustrating a configuration of a system for analysis of partial discharge defects of a gas insulated switchgear according to a second embodiment of the present invention. FIG. 4A is an exemplary view illustrating a PRPD screen for a partial discharge signal. FIG. 4B is an exemplary view illustrating that position information of a detecting sensor and a neighboring sensor is displayed on a screen of a display unit. FIG. 5 is a flowchart illustrating a method for analyzing a system for analysis of partial discharge defects of a gas insulated switchgear according to a first embodiment of the present invention. FIG. 6 is a flowchart illustrating a method for analyzing partial discharge defects of a gas insulated switchgear according to a second embodiment of the present invention.

As shown in FIG. 2, the system for analysis of partial discharge defects of a gas insulated switchgear according to a first embodiment of the present invention includes a detecting sensor 100, a neighboring sensor 200, a controller 300 and a display unit 400.

The detecting sensor 100 is attached to a specific position inside a gas insulated switchgear, and is configured to sense a partial discharge signal generated from the gas insulated switchgear. And the detecting sensor 100 is configured to detect a current pulse signal due to a partial discharge, or detect an ultrasonic signal due to a partial discharge.

The detecting sensor 100 is implemented as one of a UFH sensor, a VHF sensor, an HF sensor, an ultrasonic sensor and a TEV sensor. But the present invention is not limited to this, and various sensors may be used as the detecting sensor 100.

The neighboring sensor 200 is arranged near the detecting sensor 100 in one or more in number, and detects a signal generated from the periphery of the detecting sensor 100.

Like the detecting sensor 100, the neighboring sensor 200 is configured to detect a current pulse signal due to a partial discharge, or detect an ultrasonic signal due to a partial discharge. And the neighboring sensor 200 is implemented as a UFH sensor, a VHF sensor, an HF sensor, an ultrasonic sensor, or the like.

The controller 300 receives a signal sensed by the detecting sensor 100, thereby determining whether a partial discharge signal has occurred or not using a partial discharge signal determination algorithm.

If the signal sensed by the detecting sensor 100 is determined as a partial discharge signal, the controller 300 receives a signal sensed by the neighboring sensors 200 arranged close to the detecting sensor 100, at a time point when the partial discharge signal is sensed by the detecting sensor 100. Then, the controller 300 calculates a partial discharge charge amount and the number of times of partial discharge, based on the sensed detection signal.

If the partial discharge charge amount and the number of times of partial discharge are more than a preset value, the controller 300 provides signal information to a monitor (surveillant) on the display unit 400. In this case, the signal information includes partial discharge signal information on a partial discharge signal sensed by the detecting sensor 100, and detection signal information on a detection signal sensed by the neighboring sensor 200.

On the contrary, if the partial discharge charge amount and the number of times of partial discharge are less than the preset value, the controller 300 provides only the partial discharge signal information on the partial discharge signal sensed by the detecting sensor 100, on the display unit 400.

The display unit 400 provides a monitor with partial discharge signal information on a partial discharge signal sensed by the detecting sensor 100, or both detection signal information on a detection signal sensed by the neighboring sensor 200 and the partial discharge signal information, on a screen.

FIG. 4A is an exemplary view illustrating that a PRPD screen for a partial discharge signal is displayed on the display unit of the gas insulated switchgear according to the present invention. FIG. 4B is an exemplary view illustrating that position information of a detecting sensor and a neighboring sensor is displayed on a screen of the display unit.

As shown in FIG. 4A, partial discharge signal information and detection signal information are provided to a monitor, in the form of phase resolved partial discharge (PRPD) pattern information, the PRPD pattern having a waveform analyzed based on a phase and an amplitude. A PRPD chart 410 with respect to the partial discharge signal information, and a PRPD chart 420 with respect to the detection signal information are provided to a single screen. And a screen indicating a position of the detecting sensor 100 and the neighboring sensor 200 is provided together with the PRPD charts 410, 420.

A diagnosis screen with respect to a partial discharge, provided on the display unit 400, is not limited to the PRPD charts 410, 420 and position information 430. A phase, a size and the number of times of the partial discharge signal and the detection signal with respect to a frequency may be provided onto a 2D or 3D screen. Alternatively, the phase, the size and the number of times may be modified in various forms such that a defect cause of the gas insulated switchgear, whether a defect has occurred or not, etc. are checked.

Thus, a monitor of the gas insulated switchgear receives information on signals sensed by the detecting sensor 100 and the neighboring sensor 200 adjacent to the detecting sensor 100, on a single screen. Accordingly, the monitor may analyze a defect cause of the gas insulated switchgear, and whether a defect exists on a partial discharge-occurred position, more precisely.

As shown in FIG. 3, like the system for analysis of partial discharge defects of a gas insulated switchgear according to the first embodiment, a system for analysis of partial discharge defects of a gas insulated switchgear according to a second embodiment includes a detecting sensor 100, a neighboring sensor 200, a controller 300 and a display unit 400. However, the system for analysis of partial discharge defects of a gas insulated switchgear according to the second embodiment further includes a storage unit 500 configured to store therein detection signal information.

Once a partial discharge signal is sensed by the detecting sensor 100, detection signal information sensed by the neighboring sensor 200 at a time point when the partial discharge signal is sensed, is stored in the storage unit 500. Accordingly, when searching for a history of occurrence of partial discharges, a monitor may check not only history information of the detecting sensor 100 which has sensed a partial discharge, but also history information of the neighboring sensor 200 arranged close to the detecting sensor 100. This can enhance a user's convenience in analyzing defects, or enhance accuracy on analysis of defects.

Hereinafter, a method for analyzing partial discharge defects of a gas insulated switchgear according to first and second embodiments of the present invention will be explained in more detail with reference to FIGS. 5 and 6.

As shown in FIG. 5, a method for analyzing partial discharge defects of a gas insulated switchgear according to a first embodiment includes determining whether a partial discharge signal has occurred or not, by sensing a signal generated from the inside of the gas insulated switchgear, by the detecting sensor 100 installed at the gas insulated switchgear (S101).

If the signal sensed by the detecting sensor 100 is determined as a partial discharge signal, a partial discharge charge amount and the number of times of partial discharge are calculated, based on a detection signal sensed by a plurality of neighboring sensors 200 positioned near the detecting sensor 100. Then, it is determined whether the calculated partial discharge charge amount and the calculated number of times of partial discharge are more than a reference value (S103).

If the calculated partial discharge charge amount and the calculated number of times of partial discharges are more than the reference value, a PRPD chart of partial discharge signal information on a partial discharge signal, and a PRPD chart of detection signal information on a detection signal are provided to a screen of the display unit 400 (S107). On the contrary, if the calculated partial discharge charge amount and the calculated number of times of partial discharges are less than the reference value, only the PRPD chart of the partial discharge signal information is provided to the screen of the display unit 400 (S105). In this case, both position information of the detecting sensor 100, and position information of the neighboring sensor 200 are displayed on the screen of the display unit 400.

As shown in FIG. 6, in a method for analyzing partial discharge defects of a gas insulated switchgear according to a second embodiment, if a partial discharge charge amount and the number of times of partial discharges are more than a reference value, detection signal information of the neighboring sensors 200 on the partial discharge charge amount and the number of partial discharges more than the reference value is additionally stored.

That is, like in the method for analyzing partial discharge defects of a gas insulated switchgear according to the first embodiment, in the method for analyzing partial discharge defects of a gas insulated switchgear according to the second embodiment, it is determined whether a partial discharge signal has occurred or not (S201). Then, a partial discharge charge amount and the number of times of partial discharges are calculated with respect to a detection signal sensed by the neighboring sensors 200, and it is determined whether the calculated partial discharge charge amount and the calculated number of times of partial discharges are more than a reference value (S203). If the calculated partial discharge charge amount and the calculated the number of times of partial discharges are more than the reference value, detection signal information on the detection signal sensed by the neighboring sensors 200 is stored in the storage unit 500 (S205). Then, both the partial discharge signal information and the detection signal information are provided to a monitor through the display unit 400 (S207).

On the contrary, if the calculated partial discharge charge amount and the calculated the number of times of partial discharges are less than the reference value, only the partial discharge signal information on the partial discharge signal is provided to the monitor, through the display unit 400 (S209).

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A system for analysis of partial discharge defects of a gas insulated switchgear, comprising:
    a detecting sensor configured to sense a signal generated from the gas insulated switchgear;
    one or more neighboring sensors arranged close to the detecting sensor, and configured to sense a signal generated from the periphery of the detecting sensor;
    a controller configured to determine whether the signal sensed by the detecting sensor is a partial discharge signal or not, configured to calculate a partial discharge charge amount and the number of times of partial discharges based on a detection signal sensed by the neighboring sensor when the partial discharge signal is sensed; and
    a display unit configured to display partial discharge signal information based on the partial discharge signal or detection signal information based on the detection signal, under control of the controller,
    wherein if it is determined that the signal sensed by the detecting sensor is the partial discharge signal,
    the controller controls the display unit to display the partial discharge signal information based on the partial discharge signal and the detection signal information based on the detection signal when the partial discharge charge amount and the number of times of partial discharges are more than reference values, and
    the controller controls the display unit to display only the partial discharge signal information based on the partial discharge signal when the partial discharge charge amount and the number of times of partial discharges are less than the reference values.

2. The system of claim 1, further comprising a storage unit configured to store therein the detection signal information of the neighboring sensors on the partial discharge charge amount and the number of times of partial discharges more than the reference values, under control of the controller, if the partial discharge charge amount and the partial discharge signal are more than the reference values.

3. The system of claim 1, wherein the display unit is further configured to display position information of the detecting sensor and the neighboring sensor.

4. The system of claim 1, wherein the partial discharge signal information and the detection signal information are PRPD (phase resolved partial discharge) pattern information.

* * * * *